United States Patent
Bourilkov et al.

(10) Patent No.: US 9,823,310 B2
(45) Date of Patent: Nov. 21, 2017

(54) BATTERY STATE OF CHARGE INDICATOR WITH AN INDICATOR CIRCUIT

(71) Applicant: DURACELL U.S. OPERATIONS, INC., Wilmington, DE (US)

(72) Inventors: Jordan Todorov Bourilkov, Bethel, CT (US); Steven Jeffrey Specht, Brookfield, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 782 days.

(21) Appl. No.: 14/341,240

(22) Filed: Jul. 25, 2014

(65) Prior Publication Data
US 2016/0025818 A1    Jan. 28, 2016

(51) Int. Cl.
| G08B 21/00 | (2006.01) |
| G01R 31/36 | (2006.01) |
| H01M 10/48 | (2006.01) |
| H01M 6/50 | (2006.01) |
| H02J 7/00 | (2006.01) |
| G08B 21/18 | (2006.01) |
| H01G 2/00 | (2006.01) |

(52) U.S. Cl.
CPC ......... *G01R 31/3686* (2013.01); *G01R 31/36* (2013.01); *G08B 21/182* (2013.01); *H01G 2/00* (2013.01); *H01M 6/505* (2013.01); *H01M 6/5044* (2013.01); *H01M 10/48* (2013.01); *H01M 10/488* (2013.01); *H02J 7/0047* (2013.01); *H02J 2007/005* (2013.01)

(58) Field of Classification Search
CPC ......... G01R 31/3686; G01R 19/16542; H01M 10/488; H01M 6/5044
USPC .............. 340/636.1, 636.11, 636.12, 636.15, 340/636.19, 636.2; 320/134–136
See application file for complete search history.

(56) References Cited

U.S. PATENT DOCUMENTS

| 3,354,565 | A | | 11/1967 | Emmons et al. |
| 3,992,228 | A | * | 11/1976 | Depoix ............... H01M 6/5044 429/90 |
| 3,993,985 | A | | 11/1976 | Chopard et al. |
| 4,117,475 | A | | 9/1978 | Ebihara |
| 4,149,146 | A | | 4/1979 | Ebihara et al. |
| 4,302,751 | A | | 11/1981 | Nakauchi et al. |
| 5,250,905 | A | | 10/1993 | Kuo et al. |
| 5,339,024 | A | | 8/1994 | Kuo et al. |

(Continued)

FOREIGN PATENT DOCUMENTS

JP    61169781    7/1986

OTHER PUBLICATIONS

PCT International Search Report with Written Opinion in corresponding international application PCT/US2015/041874 dated Oct. 15, 2015.

*Primary Examiner* — Toan N Pham
(74) *Attorney, Agent, or Firm* — Marshall, Gerstein & Borun LLP

(57) ABSTRACT

A state of charge indicator including an indicator with a display threshold and an indicator circuit electrically coupled to the indicator such that when a main cell voltage of a main cell is greater than a display threshold, the indicator circuit applies a driver voltage to the indicator such that the indicator is inactive and when the main cell voltage is less than the display threshold, the indicator circuit applies the driver voltage to the indicator such that the indicator is active.

20 Claims, 8 Drawing Sheets

(56) References Cited

U.S. PATENT DOCUMENTS

| | | |
|---|---|---|
| 5,396,177 A | 3/1995 | Kuo et al. |
| 5,458,992 A | 10/1995 | Bailey et al. |
| 5,596,278 A | 1/1997 | Lin |
| 5,737,114 A | 4/1998 | Bailey et al. |
| 5,849,046 A | 12/1998 | Bailey et al. |
| 6,156,450 A * | 12/2000 | Bailey .................. G01D 7/005 429/122 |
| 6,483,275 B1 | 11/2002 | Nebrigic et al. |
| 9,235,044 B2 * | 1/2016 | Specht ................. G02B 26/005 |

\* cited by examiner

BATTERY STATE OF CHARGE INDICATOR WITH AN INDICATOR CIRCUIT

TECHNICAL FIELD

The present disclosure is generally directed to indicator apparatuses for electrical storage devices.

BACKGROUND

On-cell indicators require a user to press one or two buttons, wait for several seconds and then observe an indicator that shows the state of charge of the battery. This is inconvenient for the user because they must remove the batteries from the device, hold the battery, and press the button(s). The user must then reinstall the battery into the device. This is cumbersome and time consuming.

Electro-chromic displays draw very little power from the battery being tested and can therefore remain on and allow the user to just look at the battery to determine the state of charge. However, the current state-of-the-art in electro-chromic indicator technology has short operational life (less than a few weeks once activated) if it is continuously powered in the on condition.

Accordingly, a need exists for improved on-cell indicators that do not require user activation and increase the service life of the electro-chromic display.

SUMMARY

A state of charge indicator including an indicator with a display threshold and an indicator circuit electrically coupled to the indicator such that when a main cell voltage of a main cell is greater than a display threshold, the indicator circuit applies a driver voltage to the indicator such that the indicator is inactive and when the main cell voltage is less than the display threshold, the indicator circuit applies the driver voltage to the indicator such that the indicator is active.

In another embodiment, an energy storage replacement indicator system may include a display electrically coupled to an energy storage device with an energy storage voltage and an indicator circuit electrically coupled to the display. The indicator circuit may establish a display threshold such that when the energy storage voltage is greater than the display threshold, the indicator circuit applies a driver voltage to the display such that the display is inactive, and when the energy storage voltage is less than the display threshold, the indicator circuit applies the driver voltage to the display such that the display is active.

In yet another embodiment, a battery state of charge indicator may include a CMOS output type voltage detector integrated circuit and an indicator electrically coupled between a voltage output of the CMOS output type voltage detector integrated circuit and a battery having a battery voltage. The battery state of charge indicator may operate such that when the battery voltage is greater than a display threshold, the CMOS output type voltage detector integrated circuit applies a driver voltage to the indicator such that the indicator is inactive and when the battery voltage is less than the display threshold, the CMOS output type voltage detector integrated circuit applies the driver voltage to the indicator such that the indicator is active.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

A state of charge indicator coupled to a battery may be used to determine the state of charge (e.g., the amount of energy or charge remaining) of the battery. The state of charge indicator may have multiple segments (e.g., one or more step indicators), much like a fuel bar gauge on a cell phone, to indicate fractions of charge remaining in the battery. The one or more step indicators may indicate the state of charge of the battery by changing the color, by causing indicia to appear, or changing indicia on the label of the battery. The state of charge indicator does not require activation or actuation on the part of a user, or user intervention to indicate the state of charge of the battery. This may allow a user to determine the state of charge of a battery while the battery is still electrically connected to a device, such as a toy, without having to remove the battery and actuate indicator buttons.

Figure 1:
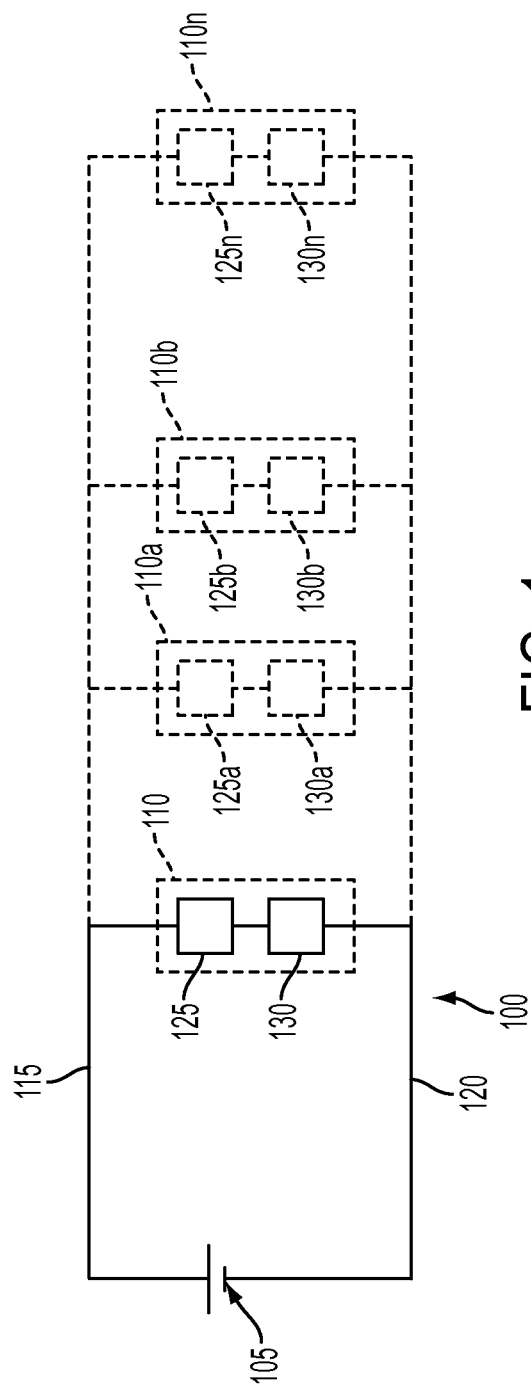
FIG. 1 depicts one embodiment of a state of charge indicator for an energy storage device according to one or more embodiments shown and described herein.

Referring now to FIG. 1, a state of charge indicator 100 is shown. The state of charge indicator 100 may include an energy storage device 105 electrically coupled to a step indicator 110. As used throughout, a single step indicator 110 may be used or alternately, two or more step indicators 110a, 110b, . . . 110n may be used to indicate the state of charge of the energy storage device 105. Any discussion relating to the step indicator 110 may be applied to the two or more step indicators 110a, 110b, . . . 110n. The state of charge indicator 100 may be used to indicate an energy level of the energy storage device 105. The state of charge indicator 100 may indicate the energy level of the energy storage device 105 via an audible, a visible, a tactile, or a pallesthesia indication. Pallesthesia is defined as the ability to sense a vibration. The indication of the energy level is discussed in greater detail below. The energy storage device 105 may be a battery, one or more main cells, a capacitor, a bank of capacitors, or a fuel cell. If the energy storage device is a battery, the battery may be a disposable battery or a rechargeable battery. The battery may include one or more main cells and be of any shape or size. For example, the battery may be an AAAA, AAA, AA, C, D, CR2, 123 A, or any other standard size. The battery may be substantially cylindrical or substantially rectangular.

The step indicator 110 may include a first lead 115 and a second lead 120 that electrically couple the step indicator 110 to the energy storage device 105. The first lead 115 and the second lead 120 may be coupled to the energy storage device 105 by resistance welding, laser welding, soldering, ink-jet printing or printed contact area pressed against the cell, e.g. by heat-shrinking or by conductive adhesive such as, for example, a silver epoxy or by ultrasonic welding. The step indicator 110 may comprise an indicator 125 and an indicator circuit 130. The indicator 125 may be electrically coupled to the first lead 115 and the indicator circuit 130. The indicator circuit 130 may be electrically coupled to the indicator 125 and the second lead 120. In one embodiment, the indicator 125 may provide a visual indication using a light emitting diode (LED) circuit, a liquid-crystal display (LCD), an electro-chromic display, a thermo-chromic display, an electro-wetting display, an electrochemical display, a MEMS display, an electrophoretic display (electronic paper), a structural color display, and/or an electrostatic display. In another embodiment, the indicator 125 may provide an auditory indication using, for example, a piezo buzzer, an acoustic generator and speaker, a bell or other type of percussion device or instrument, a magnetic buzzer, or electromechanical buzzer. In yet another embodiment, the indicator 125 may provide a tactile indication using, for example, a pop-up protrusion or a blister. The tactile indicator may be flush to the surface of the indicator 125 in a first state and protrude from the surface of the indicator 125 in a second state. In another embodiment, the pallesthesia indication may be a mechanical or electromechanical means to provide the sense of vibration such as, for example, an offset weight motor or a piezoelectric bender coupled to a haptic driver or controller. The pallesthesia indication may induce a vibration in the device electrically coupled to the energy storage device 105 such that the vibration signals to a user of the device the state of the charge of the energy storage device 105 without requiring the user to open the compartment the energy storage device 105 is housed in.

FIG. 1 depicts one step indicator 110 electrically coupled to the energy storage device 105. In another embodiment, one or more step indicators 110, 110a, 110b . . . 110n may be used to indicate one or more states of charge (i.e., one or more energy levels) of the energy storage device 105. The one or more step indicators 110, 110a, 110b . . . 110n are electrically coupled in parallel to the energy storage device 105 as shown with dashed lines in FIG. 1. The function of the one or more step indicators 110, 110a, 110b . . . 110n is discussed in greater detail below.

Figure 2:
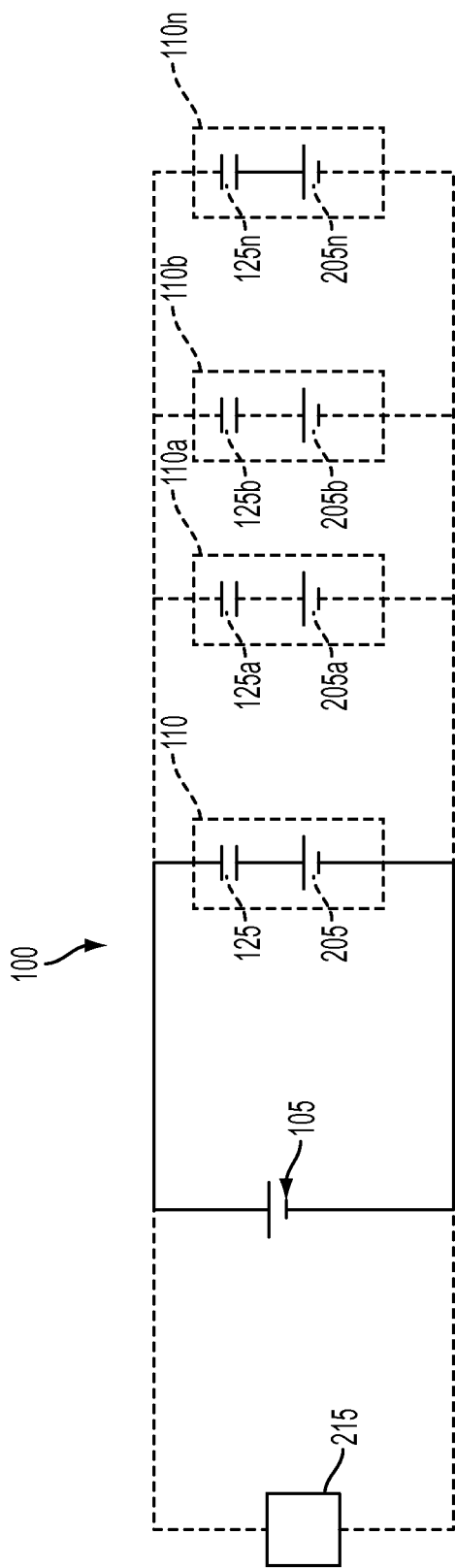
FIG. 2 depicts an indicator circuit of FIG. 1 as an auxiliary reference source according to one or more embodiments shown and described herein.

FIG. 2 depicts an auxiliary reference source 205 as the indicator circuit 130 shown in FIG. 1. In another embodiment, one or more step indicators 110, 110a, 110b . . . 110n may be used to indicate one or more states of charge (i.e., one or more energy levels) of the energy storage device 105 with the auxiliary reference source 205 as the indicator circuit 130 shown in FIG. 1. The one or more step indicators 110, 110a, 110b . . . 110n are electrically coupled in parallel to the energy storage device 105 as shown with dashed lines in FIG. Each auxiliary reference source 205 in each step indicator of the one or more step indicators 110, 110a, 110b . . . 110n may have a unique auxiliary reference source voltage. Specifically, a first step indicator 110a may include a first indicator 125a and a first auxiliary reference source 205a with a first auxiliary reference source voltage; a second step indicator 110b may include a second indicator 125b and a second auxiliary reference source 205b with a second auxiliary reference source voltage; and so on until a last step indicator 110b may include a last indicator 125b and a last auxiliary reference source 205b with a last auxiliary reference source voltage. The first auxiliary reference source voltage may be different from the second auxiliary reference source voltage, both of which are different from the last auxiliary reference source voltage. The function of the one or more step indicators 110, 110a, 110b . . . 110n is discussed in greater detail below.

The polarity of the energy device 105 and the auxiliary reference source may be inverse-proportional or reverse proportional to each other. The term "inverse-proportional" indicates that before the energy storage device 105 is connected to a load, the energy storage voltage and the auxiliary cell voltage are proportional to each other and have an inverse or reverse polarity orientation in relation to each other. In other words, the negative ends of the main cell and auxiliary reference source are electrically coupled, and the positive ends of the main cell and auxiliary reference source are electrically coupled. In one embodiment, if the energy storage device 105 is a main cell with a main cell voltage, the auxiliary reference source 205 would be an auxiliary cell with an auxiliary cell voltage such that the main cell voltage and the auxiliary cell voltage are about equal and inverse-proportional to each other. The indicator 125 may be electrically coupled on either the positive side of the electrically coupled main cell and auxiliary reference source or the negative side of the electrically coupled main cell and auxiliary reference source.

At the beginning of the life of the energy storage device 105, the electrical potential between the main cell voltage and the auxiliary cell voltage would be about zero across the indicator 125. If the indicator 125 is an electro-chromic indicator, the near zero voltage potential across the indicator 125 would not provide enough voltage to activate or energize the electro-chromic display. Therefore, the indicator 125 would remain "off" until the display threshold is crossed. This would enable the short life span of the indicator 125 to be extended to the life of the energy storage device 105 and would allow the indicator 125 to endure long storage times. As the main cell depletes its energy through a load 215, the difference in the electrical potential between main cell and the auxiliary cell would increase. In this embodiment, the auxiliary reference source would remain at a full charge or about at full charge as the main cell depletes its energy through the load. As the electrical potential difference increases, a display threshold would be crossed and the indicator 125 would be activated or transitioned from an inactive state to an active state. The indicator 125 may be subjected to the voltage difference between the main cell and the auxiliary reference cell. In other words, for the embodiment shown in FIG. 2, the difference in voltage, corresponding to the remaining electrical energy, between the energy storage device 105 and the auxiliary reference source 205 is used to power the indicator 125.

Figure 3:
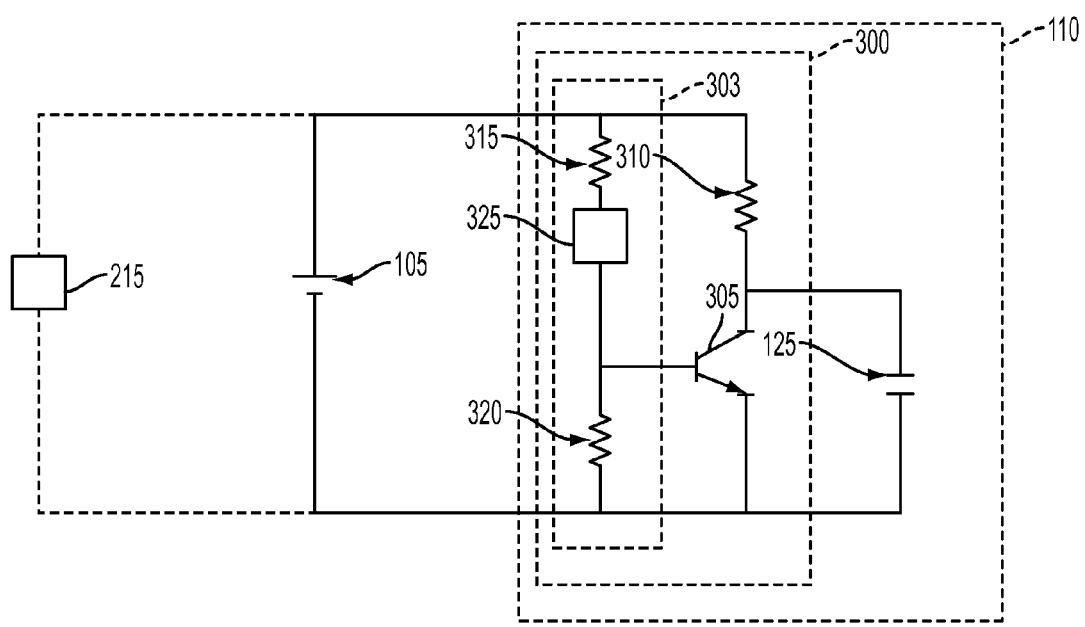
FIG. 3 depicts the indicator circuit of FIG. 1 as a transistor driver circuit according to one or more embodiments shown and described herein.

FIG. 3 depicts a transistor driver circuit 300 as the indicator circuit 130 shown in FIG. 1. The transistor driver circuit 300 may serve as an electrical shunt to ensure that the indicator 125 remains electrically isolated or in an unpowered state until such time as the indication is needed. The transistor driver circuit 300 may include a voltage divider circuit 303, a shunt transistor 305, a transition element 325, and a pull-up resistor 310. The voltage divider circuit 303 may include a first resistor 315 and a second resistor 320. The first resistor 315 is electrically coupled in series with the transition element 325 and the transition element 325 is electrically coupled in series with the second resistor 320. The transition element 325 may not be required in all embodiments. Where required, the transition element 325 may be a transistor, a diode, or other semi-conductor device that exhibits about a 0.6 V to about 0.7 V voltage drop across the transition element 325.

The voltage drop across the transition element 325 effectively sharpens the voltage transition of the transistor driver circuit 300 and hence, sharpens the display threshold. In other words, the voltage transition of the transistor driver circuit 300 is more predictable and repeatable with the transition element 325. This translates to a more predictable and repeatable display threshold. It can also offset the trigger point of the display threshold. In one embodiment, if a diode is used as the transition element 325, an extremely low-signal silicon (Si) diode may be chosen. Low signal Si diodes may have about a 0.6 V to about a 0.7 V voltage drop range with the normal current of the circuit in the milli-Amp (mA) range. If the normal operating current of the circuit is in the nano-Amp (nA) range, two Si diodes may be needed in series as each diode would exhibit about a 0.4 V voltage drop. The series combination of two Si diodes when the circuit is operating in the nA range would equate to a total of about 0.8 V voltage drop.

The pull-up resistor 310 is electrically coupled to the indicator 125 and the shunt transistor 305. In one embodiment of the transistor driver circuit 300, the first resistor 315 may be between about 2 Mega-ohm (Mohm) and about 1 kilo-ohm (kohm). The second resistor 320 may be between about 2 Mohm and about 1 kohm. The pull-up resistor may be between about 2 Mohm and about 1 kohm. In one embodiment, the shunt transistor 305 is a transistor electrically coupled across the indicator 125 and is electrically coupled to the transition element 325 and the second resistor 320. In another embodiment, the shunt transistor 305 may be a switch. The switch may be any mechanical, electro-mechanical, or electrical device that functions as a switch (i.e., makes or breaks electrical connections). The transistor driver circuit 300 may actuate the switch based on display threshold defined by the parameters of the circuit elements of the transistor driver circuit 300. For example, in one embodiment, the switch may be a relay. The transistor driver circuit 300 may energize a coil in the relay to actuate the switch when the display threshold is crossed.

Figure 4:
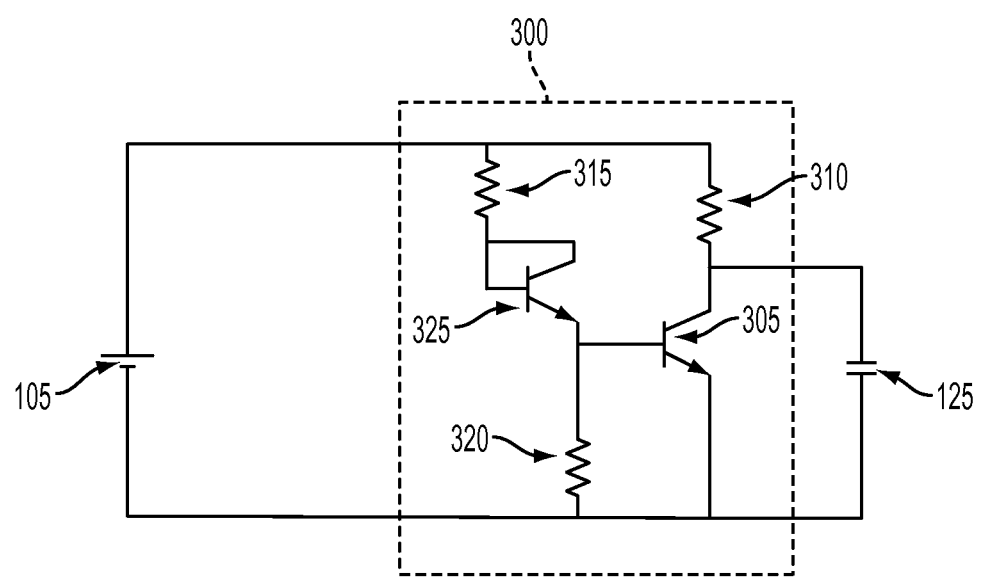
FIG. 4 depicts one embodiment of the transistor driver circuit according to one or more embodiments shown and described herein.

FIG. 4 depicts one embodiment of the transistor driver circuit 300. The first resistor 315, the second resistor 320, and the pull-up resistor 310 may all be about 1 Mohm and the transition element 325 may be a transistor. The operation of the transistor driver circuit 300 is discussed in greater detail below.

Figure 5:
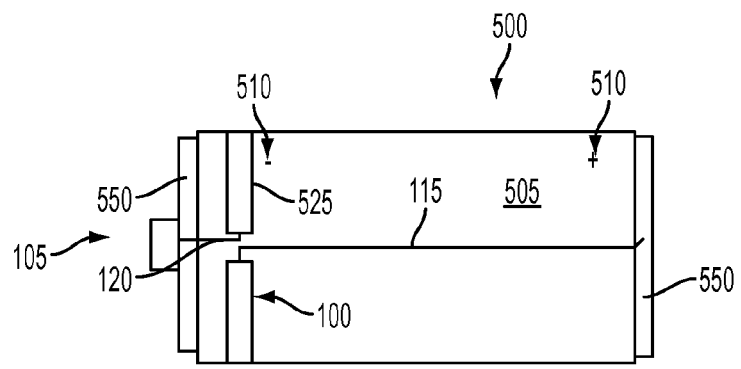
FIG. 5 depicts a ring indicator for the energy storage device according to one or more embodiments shown and described herein.
Figure 6:
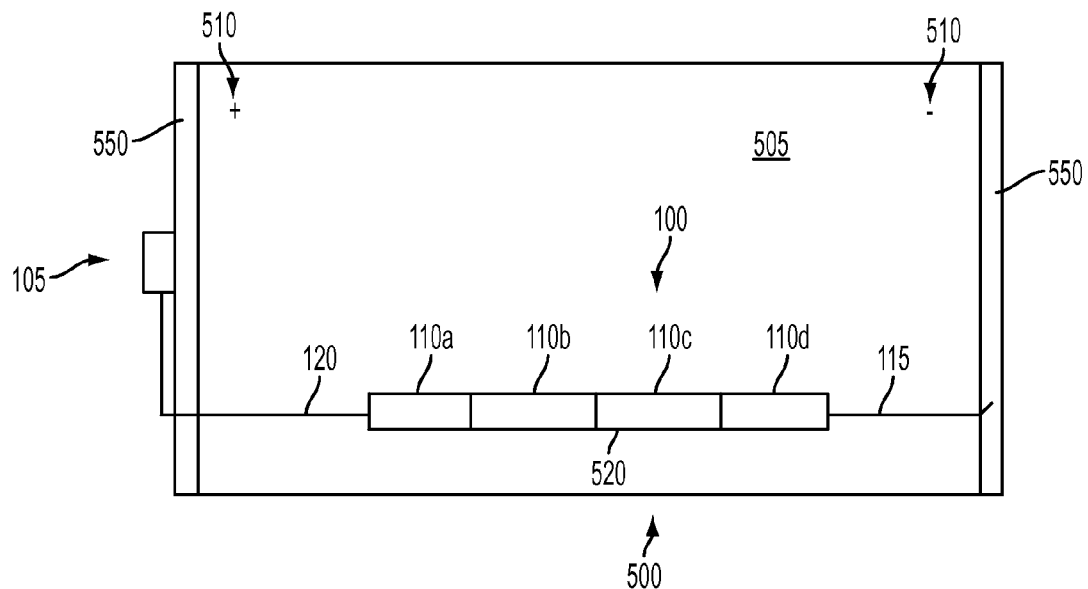
FIG. 6 depicts a segmented strip according to one or more embodiments shown and described herein.

FIGS. 5 and 6 depict a label 500 coupled to a housing 550 of an energy storage device 105. The label 500 includes a flexible substrate 505, the state of charge indicator 100, and indicia 510. The first lead 115 and the second lead 120 electrically couple the state of charge indicator 100 to the energy storage device when the flexible substrate 505 is secured to the energy storage device. The indicia 510 may include words and/or symbols to convey information to a user. The flexible substrate 505 may be a single-sided printed circuit board (PCB), a double-sided PCB, a multi-layered PCB, a protective layer, a shrinkable material, a flexible circuit board (FCB), a single sided FCB, a double sided FCB, a multi-layer FCB, a laminated foil, and/or any combination thereof. The flexible substrate 505 may include mounting tabs (not shown) or other structure to secure the flexible substrate 505 to an energy storage device (not shown). In one embodiment, the flexible substrate 505 may be secured or formed to the external shape of a battery by an adhesive or a friction fit. Alternatively, in another embodiment, the flexible substrate 505 may be a shrinkable material that is placed over the energy storage device and thermally activated to shrink to secure the flexible substrate 505 to conform to the shape of the energy storage device. In yet another embodiment, the flexible substrate 505 may consist of a curable material that is either chemical or light activated to cure and secure to the flexible substrate 505 to the energy storage device.

The components of the state of charge indicator 100 may be printed on or secured to the flexible substrate 505. For example, the auxiliary reference source 205 shown in FIG. 2 may be external to the energy storage device 105 and printed or mounted to the flexible substrate 505. In another embodiment, the auxiliary reference source 205 may be internal or within the housing of the energy storage device 105. In this embodiment, the auxiliary reference source 205 would have one common electrode with the energy storage device 105 and a second, non-common electrode that would be electrically isolated from the energy storage device 105. In other words, there may be a common anode and a first cathode of the auxiliary reference source 205 and a second cathode of the energy storage device 105. The first cathode and the second cathode would be electrically isolated from each other so that their respective energy and resulting voltage does not equalize as the energy storage device 105 is discharged. The resulting voltage and equalization refers to the display voltage described in greater detail below. The auxiliary reference source 205 may reside in a separate sealed compartment within the housing or "can" (referring to a cylindrical shape of the housing) of the energy storage device 105. The indicator 125 may be electrically coupled between the first cathode and the second cathode and coupled to the external portion of the housing. This embodiment may allow for the use of common parts between the auxiliary reference source 205 and the energy storage device 105.

The indicator 125 (FIG. 1) may be used to provide a visual display of the state of charge or energy level (e.g., an amount of power, voltage, or current) of the energy storage device 105 (FIG. 1). The visual display may be in the form of a solid bar, a graduated bar, a graduated pie chart, a numerical display, a color-changing indicator, a segmented strip, and/or combinations thereof. In one embodiment, referring to FIG. 5, a ring indicator 525 may be wound around the housing 550 such that a user may discern the state of charge of the energy storage device while it is still electrically connected to a device, such as a toy, without having to remove the energy storage device. For example, a user may open a battery compartment on a device and discern the state of the charge of the battery without the need to actuate any buttons or other actions, including but not limited to rotating the battery to read the indicator. The ring indicator 525 is shown in FIG. 5 near one end of the label 500; however, it should be understood that the ring indicator may be positioned anywhere on the label 500.

In another embodiment, referring to FIG. 6, the segmented strip 520 may be configured to indicate various states of charge (e.g., level of energy, threshold of energy, or amount of energy) of the energy storage device 105. For example, the segmented strip 520 may allow for the monitoring of the state of charge (i.e., remaining energy or power) of the energy storage device 105 as the energy storage device 105 is depleted. The segments of the segmented strip 520 may be activated sequentially or cumulatively by separate electronic circuitry to provide the desired battery status information to a user. Furthermore, the segments of the segmented strip 520 may be activated from left to right, from right to left, from a center of the segmented strip 520 to both ends, or from both ends to the center. In one embodiment, and referring to FIG. 1, the segments of the state of charge indicator 100 may be 110, 110a, 110b . . . 110n and electrically coupled to the energy storage device via the first lead 115 and the second lead 120. FIG. 6 illustrates four step indicators 110a, 110b, 110c, and 110d of the embodiment shown in FIG. 1, however, it should be understood that the embodiment shown in FIG. 6 is not limited to only four step indicators 110a, 110b, 110c, and 110d.

As explained above, the one or more step indicators 110a, 110b, 110c, and 110d may be used to indicate one or more states of charge (i.e., one or more energy levels) of the energy storage device 105. In other words, each step indicator 110a, 110b, 110c, and 110d is configured to indicate when a display threshold of the energy storage device 105 is reached. For example, a state of charge indicator 100 may include a first step indicator 110a with a first display threshold corresponding to a first energy level of the energy storage device 105 and a second step indicator 110b with a second display threshold corresponding to a second energy level of the energy storage device 105. If the first display threshold is set at about 1.5 V and the second display threshold is set at about 1.2 V, the first step indicator 110a will provide an indication when the energy level of the energy storage device 105 reaches an energy level corresponding to about 1.5 V and the second step indicator 110b will provide an indication when the energy level of the energy storage device 105 reaches an energy level corresponding to about 1.2 V. Therefore, each step indicator of the one or more step indicators 110a, 110b, 110c, and 110d corresponds to a specific energy level of the energy storage device 105 and provides an indication when that energy level is detected or sensed by each step indicator of the one or more step indicators 110a, 110b, 110c, and 110d.

The segmented strip 520 may therefore indicate a full colored (e.g., yellow) bar across about the full length of the segmented strip 520 when the energy storage device 105 is new. As the energy of the energy storage device 105 is depleted and the display threshold of the individual step indicators 110 is crossed, each step indicator will transition from the inactive to the active state. Therefore, the segmented strip 520 will indicate the state of charge of the battery based on how many of the step indicators (e.g., 110a, 110b, 110c, and/or 110d) indicate the background color. Each step indicator 110, 110a, 110b, 110c, and/or 110d may be indicative of a fraction of the energy remaining in the energy storage device 105. It should be understood that the segmented strip 520 is not limited to a color, for example yellow and depending on how many increments of a fraction are desired, the one or more step indicators 110, 110a, 110b, . . . 110n of FIG. 1 may be used.

For example, referring to the four step indicators 110a, 110b, 110c, and 110d of the segmented strip 520 of FIG. 6, when all four step indicators are inactive, four colored backgrounds are shown and may be indicative of about 100% charge or about 100% energy level of the energy storage device 105 remaining. As the energy of the energy storage device 105 is depleted, and more step indicators (e.g., 110a, 110b, 110c, and/or 110d) become active, the fraction indication will change. One active and three inactive step indicators (e.g., 110a, 110b, 110c, and/or 110d) may be indicative of about 75% energy level of the energy storage device 105 remaining. Two active and two inactive step indicators (e.g., 110a, 110b, 110c, and/or 110d) may be indicative of about 50% energy level of the energy storage device 105 remaining. Three active and one inactive step indicators (e.g., 110a, 110b, 110c, and/or 110d) may be indicative of about 25% energy level of the energy storage device 105 remaining. All four active step indicators (e.g., 110a, 110b, 110c, and 110d) may be indicative of the energy storage device 105 in need of replacement.

Still referring to FIG. 6, in one embodiment, the segmented strip 520 may have two step indicators with a first step indicator 110a and a second step indicator 110b. The first step indicator 110a and the second step indicator 110b may be electrically coupled to the energy storage device 105 in parallel. With reference to the structure illustrated by FIG. 1, the first step indicator 110a may include a first indicator 125a and a first indicator circuit 130a. The first indicator circuit 130a may define a first driver voltage and a first display threshold. The second step indicator 110b may include a second indicator 125b and a second indicator circuit 130b. The second indicator circuit 130b may define a second driver voltage and a second display threshold. The first display threshold may not equal the second display threshold. For example, the first display threshold may be greater than the second display threshold. The first step indicator 110a and the second step indicator 110b may be indicative of a fraction of a fully charged energy storage device 105 voltage value.

Referring to the first step indicator 110a, when the energy storage device 105 voltage is greater than the first display threshold, the first indicator circuit 130a applies the first driver voltage to the first indicator 125a such that the first indicator 125a is inactive. In addition, when the energy storage device 105 voltage is less than the first display threshold, the first indicator circuit 130a applies the first driver voltage to the first indicator 125a such that the first indicator 125a is active.

Referring to the second step indicator 110b, when the energy storage device 105 voltage is greater than the second display threshold, the second indicator circuit 130b applies the second driver voltage to the second indicator 125b such that the second indicator 125b is inactive. Also, when the energy storage device 105 voltage is less than the second display threshold, the second indicator circuit 130b applies the second driver voltage to the second indicator 125b such that the second indicator 125b is active.

It should be understood that the step indicator 110 as shown in FIGS. 2, 3, and 4 may also be one or more step indicators as described above and shown in FIGS. 1 and 6.

Referring now to the indicator 125 as shown in FIGS. 1 through 4, the indicator 125 may be transmissive to light (e.g., transparent, clear, or see through) when it is inactive and colored (e.g., opaque, black, or blue) when active. Inactive is defined as when the indicator 125 is not powered or not energized, or minimally powered or minimally energized below an activation voltage such that the indicator 125 remains transmissive to light. In other words, the indicator 125 is in an oxidation state and electrically is in an open circuit state. Transmissive to light is defined as the ability of light to travel through the indicator 125 and to illuminate a colored background beneath the indicator 125 or the ability of a user to interpret the color of the color background beneath the indicator 125. Active is defined as being powered or energized above an activation voltage, e.g. which drives an electro-chromic indicator electrode from the oxidized state to a reduced state such that the indicator 125 becomes substantially opaque. Opaque means the indicator 125 does not allow light to travel through the indicator 125 (i.e., light cannot illuminate a colored background beneath the indicator 125) or does not allow a user to interpret the color of the colored background beneath the indicator 125. In other words, in the active state, the colored background is not visible through the indicator 125. The indicator will reflect light of a specific bandwidth where the specific bandwidth is chosen by the chemical composition of the indicator 125 as further explained below. The indicator 125 changes states or transitions between the transmissive state (i.e., inactive state) to the colored state (i.e., active state) depending on the electrical potential applied across the indicator 125.

Furthermore, when the indicator 125 fails, it fails in the active state and is substantially opaque. The failure of the indicator 125 means that the operating life of the indicator is over and the indicator 125 is locked in the active state regardless of the driver voltage. Detailed workings of the indicator 125 are described below.

In one embodiment, the colored background may be a substrate that is coupled to the indicator 125. In another embodiment, the colored background may be sandwiched between the indicator 125 and the flexible substrate 505 of FIGS. 5 and 6. Alternatively, in yet another embodiment, the colored background may be printed directly on the indicator 125 or on the flexible substrate 505. In both embodiments, the colored background may be fully covered by the indicator 125 or at least partially covered by the indicator 125. The colored background may be of any color. In some embodiments, the colored background is a color that contrasts with the active state of the indicator 125. For example, the colored background may be orange or yellow which will contrast with the black or blue color of an active state indicator 125. Furthermore, the contrast between the active state and the inactive state may be a shiny background and a dull active state or vice versus.

In some embodiments, the inactive state of the indicator 125 may not be transmissive to light (i.e., clear) but may transition from one color to another as the indicator transitions from the inactive state to the active state. In this embodiment, a background color is not needed because the indicator 125 provides both the active color and the inactive color. In all embodiments, the transition from the inactive state to the active state is perceived by a user.

Figure 7:
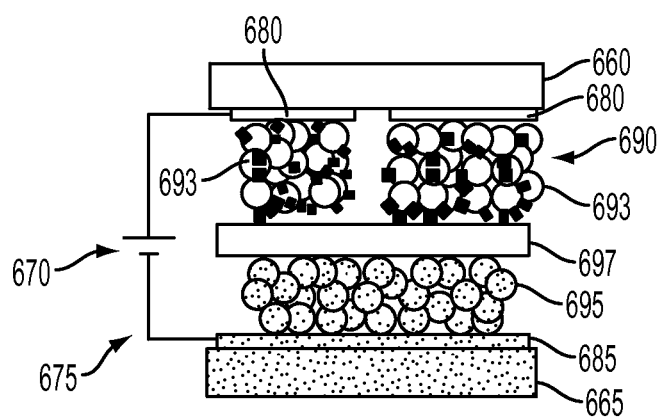
FIG. 7 depicts a sandwich type indicator according to one or more embodiments shown and described herein.

Referring to FIG. 7, a sandwich type indicator 675 is shown. The sandwich type indicator 675 illustrates one type of structure of the indicator 125 described above. The sandwich type indicator 675 is an electro-chromic display and may use electro-chromic technology based on the migration of color-bearing particles under the influence of an electrical potential 670, sometimes referred to as a chromophoric [electrophoretic] system or chromophoretic system. The electrical potential 670 may be the electrical motive force applied to the sandwich type indicator 675 from the energy storage device 105 of FIGS. 1 and 2, from the auxiliary reference source 205, or the combination of the two. The electrical potential 670 is applied to a top electrode 680 and a bottom electrode 685 which are arranged opposite to each other. The top electrode 680 and the bottom electrode 685 may be made from indium tin oxide, aluminum, copper, or carbon. A working electrode 690 is formed by the electro-chromic ink 693. A plurality of chromophoric particles 695 move through a separation layer 697 when the electrical potential 670 is applied. As the plurality of chromophoric particles 695 accumulate near the top electrode 680, a color change may become visible in the indicator 125. The plurality of chromophoric particles 695 may return to the bottom electrode 685 when the electrical potential 670 is removed from the top electrode 680 and the bottom electrode 685. The separation layer 697 may include a reflective layer of ion permeable particles that reflect white light. A top substrate 660 and a bottom substrate 665 provide structural support for the indicator 125 and may be clear (i.e., allow all visible wavelengths to pass through the substrate) or they may be opaque. In one embodiment, the top substrate 660 is clear to allow the accumulation of the plurality of chromophoric particles 695 to be visible at the top electrode 680.

In yet another embodiment of the indicator 125, an activated polymer may be used as a modulation mechanism. As the modulated mechanism, the activated polymer may have a reduced state and an oxidized state. The activated polymer may be PEDOT:PSS (i.e., poly(3,4-ethylenedioxythiophene) poly(styrenesulfonate)) and may darken when the electrical potential 670 is applied to the indicator 125 to drive it from its oxidized state to its reduced state. In the reduced state, the activated polymer absorbs mainly the red to yellow part of the electromagnetic spectrum, giving the active polymer a strong blue color. In the oxidized state, the activated polymer turns almost transparent with a weak sky-bluish line of color. PSS appears completely transparent at visible light wavelengths.

Figure 8:
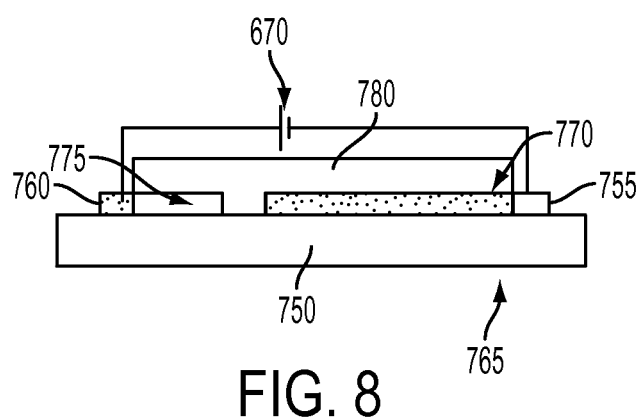
FIG. 8 depicts a flat type indicator according to one or more embodiments shown and described herein.

Referring now to FIG. 8, a flat type indicator 765 is shown. The flat type indicator 765 illustrates one type of structure of the indicator 125 described above. The flat type indicator 765 is an electro-chromic display and may use electro-chromic technology based on the migration of color-bearing particles under the influence of an electrical potential 670, sometimes referred to as a chromophoric [electrophoretic] system or chromophoretic system. In this embodiment, instead of a layered structure of the sandwich type indicator 675 of FIG. 7, the indicator components are laid out on a common substrate 750. Still referring to FIG. 8, the common substrate 750 may be a paper product, a plastic product, a glass product, or a metal product. A first electrode 755 and a second electrode 760 are electrically coupled to the electrical potential 670. The first electrode 755 and the second electrode 760 may be made from indium tin oxide, aluminum, copper, carbon, or other suitable conductive material. The PEDOT:PSS is distributed between a first strip 770 electrically coupled to the first electrode 755 and a second strip 775 electrically coupled to the second electrode 760. A solid electrolyte 780 permits ionic conduction between 670 and the second strip 775 while preventing electronic conduction between the first electrode 755 and the second electrode 760. As the electrical potential 670 is applied between the first electrode 755 and the second electrode 760, the PEDOT:PSS will oxidize, or change from the reduced state to the oxidized state, and reduce to visibly darken in color. The oxidized state corresponds to the transmissive state and the reduced state corresponds to the colored state as explained above. Examples of other electro-chromic materials which are also suitable may include Prussian blue, tungsten oxides, nickel oxides, and organic materials that have been developed specifically for electro-chromic displays.

The sandwich type indicator 675 or the flat type indicator 765 of FIGS. 6 and 7 respectively, may indicate the state of charge of the energy storage device 105 of FIG. 1 through the electrical potential 670 applied across the sandwich type indicator 675 or the flat type indicator 765. In other words, the amount of accumulation of chromophoric particles 695 and/or the amount of oxidation/reduction of the PEDOT: PSS is dependent upon the magnitude of the electrical potential 670 applied between the two electrodes (top electrode 680/bottom electrode 685 of FIG. 7 or first electrode 755/second electrode 760 of FIG. 8). The sandwich type indicator 675 or the flat type indicator 765 may electrically exhibit a very high (large value) impedance and act as a capacitor in an electric circuit.

Referring now to the indicator circuit 130 of FIG. 1, the indicator circuit 130 is configured to provide a driver voltage to the indicator 125. The driver voltage controls the indicator 125 to indicate when the state of charge (i.e., energy level) of the energy storage device 105 reaches a display threshold. In other words, the driver voltage drives or transitions the indicator 125 from the inactive state to the active state. The display threshold is a threshold that is set by the indicator circuit 130 and dictates when the energy storage device 105 energy is depleted to the point that the indicator 125 should be transitioned from the inactive state to the active state. When the energy of the energy storage device 105 is above or about equal to the display threshold, the driver voltage is applied to the indicator 125 such that the indicator 125 is inactive. When the energy of the energy storage device 210 is below or about equal to the display threshold, the driver voltage is applied to the indicator 125 such that the indicator 125 is active. The display threshold is representative of a voltage value.

As an example, in one embodiment, the energy storage device 105 may be a main cell or battery with a main cell voltage and the indicator 125 may be an electro-chromic display. When the main cell voltage is greater than or about equal to a display threshold, the indicator circuit 130 applies a driver voltage to the indicator such that the electro-chromic display is inactive and when the main cell voltage is less than or about equal to the display threshold, the indicator circuit 130 applies the driver voltage to the electro-chromic display such that the electro-chromic display is active. Examples of how the indicator circuit 130 accomplishes the application of the driver voltage and determining the display threshold are described in greater detail below.

Referring to FIG. 2, in one embodiment, the step indicator 110 may be configured to detect a battery voltage (e.g., state of charge) of a battery and indicate when the battery is depleted of energy. In this embodiment, the energy storage device 105 is a battery with a battery voltage. The auxiliary reference source 205 may be an auxiliary cell (e.g., a second battery) with an auxiliary cell voltage, where the voltage difference between the auxiliary cell voltage and the battery voltage is inverse-proportional to the battery voltage. The indicator 125 may be an electro-chromic display. The electro-chromic display may have an activation voltage of between about 0.2 volts (V) to about 0.9 V which is set by the electro-chemical system and structure make-up of the electro-chromic display. That activation voltage may be changed as the characteristics, i.e. chemical and structure make-up, of the electro-chromic display are changed. The activation voltage corresponds to the display threshold. Refer to FIGS. 6 and 7 for examples of differing structural make-ups of the electro-chromic display. The driver voltage is defined in this embodiment as the auxiliary cell voltage minus the battery voltage. At the beginning of the battery's life, the driver voltage across the indicator 125 is about equal to zero. As the battery voltage is depleted, the voltage difference (i.e., driver voltage) between the battery and the auxiliary battery increases. When the driver voltage is about equal to the display threshold, the display threshold is crossed and the electro-chromic display changes from the inactive state (i.e., transmissive) to the active state (i.e., colored). In other words, when the driver voltage is less than about the display threshold, the driver voltage applied to the indicator 125 does not activate the indicator 125 and thus the indicator 125 is inactive. When the driver voltage is about equal to or greater than about the display threshold, the driver voltage is applied to the indicator 125 which activates the indicator 125.

For example, if the battery is an alkaline battery with about 1.62 V starting voltage, when the battery voltage has depleted to a display threshold (e.g., about 1.2 V), the driver voltage of about 0.4 V will energize and drive the electro-chromic display with an activation voltage of, e.g., about 0.4 V to change states and indicate that the display threshold has been crossed. For clarification, the about 1.2 V display threshold comes from the about 1.62 V auxiliary cell voltage (equals the starting voltage of the battery) minus the about 0.4 V activation voltage of the electro-chromic display. At the start of the battery's life, the auxiliary cell voltage (about 1.62 V) would about equal the alkaline battery voltage and the driver voltage applied to the electro-chromic display would be about zero. As the alkaline battery voltage decreases, the driver voltage applied by the indicator circuit 130 would not activate the electro-chromic display as long as the battery voltage remains above the about 1.2 V display threshold. By way of another example, if the battery voltage is about 1.4 V, the driver voltage is about 0.22 V and does not activate the electro-chromic display. If the battery voltage is about 1.32 V, the driver voltage applied to the electro-chromic display is about 0.3 V which is not greater than the about 0.4 V activation voltage or below the about 1.2 V display threshold. Therefore, the driver voltage applied to the electro-chromic display does not activate the electro-chromic display. As soon as the battery voltage drops below about 1.2 V, the driver voltage applied by the indicator circuit 130 would activate the electro-chromic display. It should be noted that the electro-chromic indicator threshold is "soft" and there is somewhat gradual transition within voltage range, e.g. from about 0.4V (beginning of color change) to about 0.8V for full color intensity.

Other examples of the display threshold include about 2.5 V for Lithium Manganese Dioxide (Li—MnO2), about 1.4 V for Lithium Iron Disulfide (Li—FeS2), and about 1.4 V for Silver Oxide Button cells.

There are several methods and configurations of the step indicator 110 to set the display threshold. In one embodiment, the electrical characteristics of the indicator 125 may be changed to dictate different activation voltages. In another embodiment, and referring to FIG. 2, the voltage of the auxiliary reference source may be changed to dictate a different display threshold. In the above example with the alkaline battery of about 1.62 V, by changing the auxiliary reference source voltage, the display threshold changes or more specifically, the difference in the main cell voltage and the auxiliary cell voltage may be increased or decreased based on the auxiliary cell voltage. If, for example, the auxiliary reference source voltage is greater than the main cell voltage, the difference in voltage is greater and therefore the driver voltage is capable of driving an indicator 125 with a greater display threshold, e.g. about 1 V or greater.

Referring now to FIGS. 3 and 4, the transistor driver circuit 300 may also apply a driver voltage to the indicator 125 to dictate whether the indicator 125 is either active or inactive. In this embodiment, the indicator 125 does not experience a variable difference in potential across it as the energy storage device 105 is depleted of energy as would happen in the embodiment of FIG. 2. In this embodiment, the driver voltage is about zero across the indicator 125 until the display threshold is crossed. When the display threshold is crossed, the shunt transistor 305 turns off and the indicator 125 is energized.

The display threshold is set by the voltage divider circuit 303. As used throughout, the voltage divider circuit 303 may or may not include the transition element 325. In this embodiment, the display threshold may be about 0.6 V to about 0.7 V. Alternatively, the display threshold may be about the turn on voltage required by the shunt transistor 305. The turn on voltage of the shunt transistor 305 is dictated by the structure of the transistor and is the voltage required at the base of the shunt transistor 305 to conduct current between its collector and emitter. The turn on voltage of the shunt transistor 305 is defined through the voltage at the base of the shunt transistor 305 via the combination of the first resistor 315 and the second resistor 320 and, in some embodiments, the use of the transition element 325 in combination with the voltage divider circuit 303. In other words, the voltage divider circuit 303 is configured to turn the shunt transistor 305 on until the display threshold is crossed. The transition element 325 removes part of the excessive voltage difference between the energy storage device 105 voltage and the shunt transistor 305 bias voltage and effectively sharpens the switching transition.

In one embodiment, the indicator activation threshold may be configured to be about 0.4 V. For low-battery warning for alkaline cells the display threshold may be about 1.2 V. This can be adjusted by the resistor value of the second resistor 320. As a working example, to set the display threshold at about 1.15 V of the energy storage device, the first resistor 315 is valued at about 1 Mohm and the second resistor 320 is valued at about 1.8 Mohm. When the voltage of the energy storage device is at about 1.5 V, the voltage across the indicator 125 (across emitter and collector of the shunt transistor) is about 0.45 V. As another working example, to set the display threshold at about 1.3 V of the energy storage device, the first resistor 315 is valued at about 1 Mohm and the second resistor 320 is valued at about 1.2 Mohm. When the voltage of the energy storage device is at about 1.5 V, the voltage across the indicator 125 (across emitter and collector of the shunt transistor) is about 0.45 V. As yet another working example, to set the display threshold at about 1.45 V of the energy storage device, the first resistor 315 is valued at about 1 Mohm and the second resistor 320 is valued at about 905 kohm. When the voltage of the energy storage device is at about 1.5 V, the voltage across the indicator 125 (across emitter and collector of the shunt transistor) is about 0.45 V.

As described above, the shunt transistor 305 shunts the indicator 125 until the display threshold has been crossed. When the energy of the energy storage device 105 is above or about equal to the display threshold, the driver voltage is applied to the indicator 125 such that the indicator 125 is inactive. When the energy of the energy storage device 210 is below or about equal to the display threshold, the display voltage is applied to the indicator 125 such that the indicator 125 is active. In other words, when the shunt transistor 305 turns off, i.e. when the energy of the energy storage device 105 falls below the display threshold set by the voltage divider circuit, the indicator 125 becomes active through power provided by the pull-up resistor 310.

Figure 9:
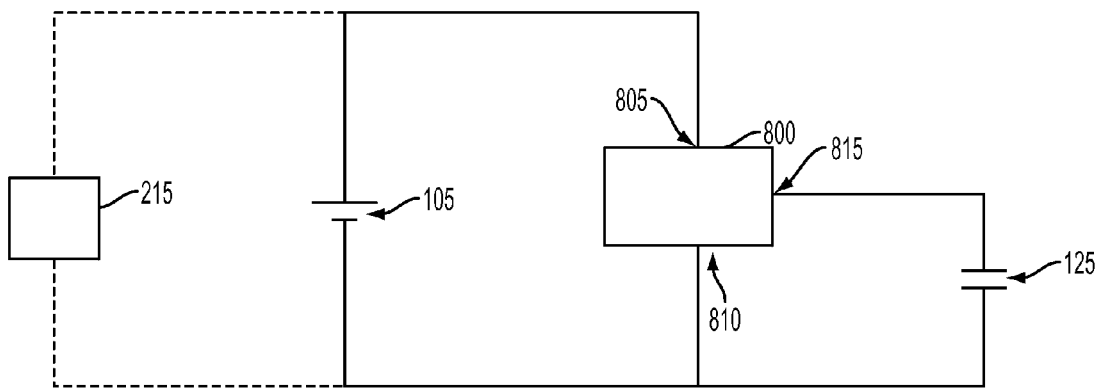
FIG. 9 depicts a voltage detector integrated circuit according to one or more embodiments shown and described herein.

Referring now to FIG. 9, the indicator circuit 130 of FIG. 1 may be a voltage detector integrated circuit 800. The voltage detector integrated circuit 800 may include a supply input 805, a ground connection 810, and a voltage output 815. The voltage detector integrated circuit 800 may operate by detecting when the energy or energy storage voltage of the energy storage device 105 drops below the display threshold for a period of detection time. When the period of detection time is exceeded, the voltage detector integrated circuit 800 will either transition the voltage output 815 from about a zero voltage to about the energy storage voltage of the energy storage device 105 or transition the voltage output 815 from about the energy storage voltage of the energy storage device 105 to about zero voltage. Both transitions are explained in greater detail below in relation to FIGS. 10 and 11. The voltage detector integrated circuit 800 may be designed to detect the energy storage voltage between about 0.9 V and about 4.8 V.

The voltage detector integrated circuit 800 provides a sharp transition between applying the driver voltage such that the indicator 125 is inactive and applying the driver voltage such that the indicator 125 is active.

The period of detection time is a quantity of time in which the detected energy storage voltage must be maintained to have crossed the display threshold before the voltage detector integrated circuit 800 transitions the voltage output 815. In other words, the quantity of time is reset to zero every time the display threshold is crossed. In order for the period of detection time to be satisfied, the quantity of time between display threshold crossings must exceed the period of detection time. This may allow for short periods of time where the load 215 has a greater demand for energy from the energy storage device 105. The energy storage device 105 may recover from the short period of great load demand and not exceed or cross the display threshold when the greater demand for energy event is over. In other words, the energy storage device may not be depleted enough for an accurate state of charge determination to be indicated by the indicator 125. The voltage detector integrated circuit 800 may be designed to not transition the voltage output 815 within a hysteresis window defined by the period of detection time. The hysteresis window may allow the voltage detector integrated circuit 800 to not fluctuate the voltage output 815 during periods of noise if, for example, the load 215 does a lot of high frequency switching or if the load is a short duration, heavy current draw load such as a flash device for a camera. In other words, the hysteresis window allows for the energy storage voltage to cross the display threshold multiple times during the period of detection time without the voltage detector integrated circuit 800 applying the driver voltage to activate the indicator 125.

In some embodiments, the combination of a slow-response time of the indicator 125 to transition from the inactive to the active state and the hysteresis window increases the length of time of the period of detection time. The slow-response time may be on the order of about a few minutes to about a few hours. Referring to FIGS. 6 and 7 above, the slow-response time may be tailored through the combination of the chosen material, surface area of the two electrodes, the conductivity of the electrolyte, and the structural layout of the indicator 125. An example of the slow-response time is discussed in greater detail below in relation to the chemistry and structure make-up of the indicator 125 as a one-shot type indicator. It should be understood that the indicator 125 is not limited to the function of the one-shot type indicator (i.e., chemistry and structure) to have a slow-response time.

Figure 10:
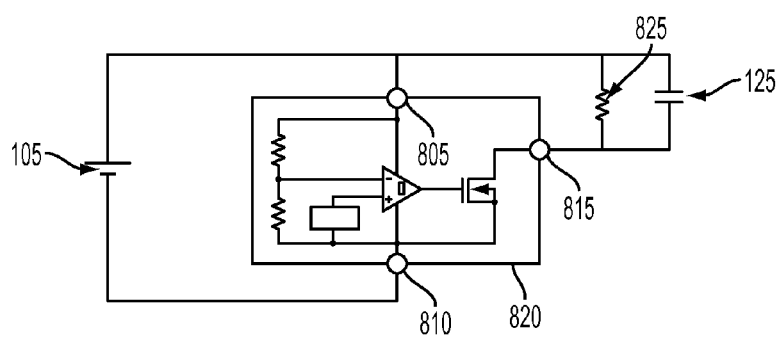
FIG. 10 depicts a open drain output type voltage detector integrated circuit according to one or more embodiments shown and described herein.

Referring to FIG. 10, an open drain output type voltage detector integrated circuit 820 is shown. The indicator 125 is electrically coupled between the supply input 805 and the voltage output 815. When the energy storage voltage reaches the display threshold, the voltage output 815 transitions from the energy storage voltage to about zero V. The transition applies the driver voltage to the indicator 125 which activates it. In another embodiment, a bleed resistor 825 may be electrically coupled in parallel with the indicator 125 to prevent or reduce the likelihood of a leakage current flowing through the indicator 125 and activating it prematurely, i.e. before the display threshold is crossed. An example of the open drain output type voltage detector integrated circuit 820 is the ROHM low voltage standard CMOS voltage detector integrated circuit, model number BU48xx series. A specific example is the BU4812.

The open drain output type voltage detector integrated circuit 820 may be coupled to a housing of a battery, placed on or incorporated within a label on the battery, or situated in a recess area of the battery housing sized to accommodate the dimensions of the open drain output type voltage detector integrated circuit 820. The recessed area on the battery housing may be a groove around the terminals of the battery. In another embodiment, the recessed area may be located anywhere on the battery housing. For example, the recessed groove may be located at either terminal of the battery or the recessed groove may be located in a spiraling groove in the battery housing between both terminals of the battery.

Figure 11:
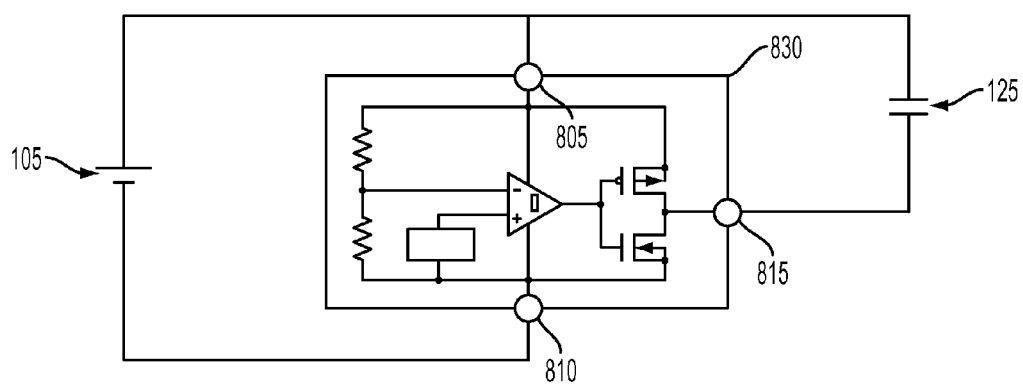
FIG. 11 depicts a complementary metal-oxide-semiconductor (CMOS) output type voltage detector integrated circuit according to one or more embodiments shown and described herein.

Referring now to FIG. 11, a CMOS output type voltage detector integrated circuit 830. The indicator 125 in this embodiment is electrically coupled between the voltage output 815 and the positive battery terminal connection 805. When the energy storage voltage reaches the display threshold, the voltage output 815 transitions from about zero V to about the energy storage voltage. The transition of the voltage output 815 applies the driver voltage to the indicator 125 which activates it. An example of the CMOS output type voltage detector integrated circuit 830 is the ROHM low voltage standard CMOS voltage detector integrated circuit, model number BU49xx series. A specific example is the BU4912. In another embodiment, the voltage detector integrated circuit 800 may be a reverse logic circuit. In this embodiment, the electrical connections may be reversed to accommodate the reverse logic circuit.

The CMOS output type voltage detector integrated circuit 830 may be coupled to the housing of a battery, placed on or incorporated within a label on the battery, or situated in a recess area of the battery housing sized to accommodate the dimensions of the CMOS output type voltage detector integrated circuit 830. The recessed area on the battery housing may be a groove around the terminals of the battery. In another embodiment, the recessed area may be located anywhere on the battery housing. For example, the recessed groove may be located at either terminal of the battery or the recessed groove may be located in a spiraling groove in the battery housing between both terminals of the battery.

The indicator 125 may have a limited service life once activated. The indicator circuit 130 may allow the indicator 125 to remain on standby or in an inactive state and preserve its service life until needed to indicate the state of charge of the energy storage device 105. In other words, the indicator 125 may still be able to indicate the state of charge of the energy storage device 105 after long periods of storage or non-use. Furthermore, the indicator circuit 130 may not allow the indicator 125 to drain energy from the energy storage device during long periods of storage or non-use. In some embodiments, the indicator circuit 130 may allow for only a single activation of the indicator 125. In other words, when the display threshold is crossed, the indicator circuit 130 activates the indicator 125 and it remains active regardless of any further changes in the state of charge (i.e., crossings of the display threshold) of the energy storage device 105. For example, the display threshold may be set at about 1.2 V and a battery may be loaded to the point where the battery voltage drops below 1.2 V. As such, the indicator circuit applies the driver voltage to active the indicator 125. If the load is removed from the battery and the battery voltage relaxes to above 1.2 V, the indicator circuit 130 will not de-active the indicator 125 until the hysteresis reset voltage is reached (around 50 mV on top of the voltage threshold).

A "one-shot" type of indicator may be used in order to lock the indication of the crossing of the display threshold. The one-shot type indicator may have a chemical composition and structure that defines a very short activated life of the one-shot indicator. For example, the one-shot type indicator may only last from about an hour to about a week. At the end of life, the one-shot type indicator may remain (i.e., locked) in its reduced or colored state and continue to display the low-battery message even after the battery discharges beyond the minimum voltage to power the one-shot indicator. When the indicator 125 is locked in its reduced or colored state, the state of charge indicator 100 of FIG. 1 will indicate a discharged energy storage device 105 regardless of how much the energy storage voltage is discharged, e.g. zero V. In one embodiment, the indicator 125 may be a one-shot type indicator by only having a limited quantity of active material that gets used within a predetermined activated time. The active material may be the PEDOT:PSS.

In another embodiment, the indicator 125 of FIG. 1 may be a one-shot type indicator that is a fuse placed on a thermo-chromic paper. The thermo-chromic paper may provide for clear visibility of the fuse by a user. The fuse may be a resistive wire woven into the thermo-chromic paper or a printed conductor applied to the thermo-chromic paper. The printed conductor embodiment may include a printed thickness and a printed width to define a fuse current in which the fuse would discolor or burn the thermo-chromic paper. The fuse may be incorporated in the label of the battery and display a dash after burn-in or activation of the fuse, thereby transitioning a letter "F" representing a full battery to a letter "E" representing a discharged battery. In other words, when the display threshold is crossed, a fuse current is applied to the fuse. The fuse current creates heat which discolors or applies burn marks to the thermo-chromic paper at the lowest portion of the "F" to transition the "F" to an "E." In another embodiment, the fuse may display a symbol or message instead of a dash.

Thermo-chromic paper may be a paper product coated with a solid-state mixture comprising a dye and a suitable matrix. When the matrix is heated above a melting point, the dye reacts with an acid on the thermo-chromic paper and shifts to a colored form (e.g., discolor from the color of the paper product). When the heat is removed, the matrix cools and solidifies to retain the colored form. Examples of thermo-chromic paper include fax paper, or a thermo-chromic indicator. Thermo-chromic paper may also include a paper product that discolors or burns when exposed to heat. In one embodiment, the fuse is coupled to the CMOS output type voltage detector integrated circuit 830 of FIG. 11 as the indicator 125. When the display threshold is crossed, the CMOS output type voltage detector integrated circuit 830 will apply the driver voltage to the fuse. The fuse will load the energy storage device 105 and "lock" the voltage to stay powered. The fuse is configured to transition from a close-circuit state to an open-circuit state (i.e., melt or destroy the fuse) within a burn time defined by the characteristics of the fuse. While the fuse is powered, it will create heat that will discolor, burn-in, or change the color form of the thermo-chromic paper, film and/or coating. Characteristics of the fuse include the dimensions of the conductor (i.e., the printed thickness and the printed width in the case of the printed conductor) and the type of material the fuse is made from. The burn-time may vary and may depend upon the quantity of the fuse current applied to the fuse. The burn-time must be less than the time to transition from the closed-circuit state to the open-circuit state. An example is a burn time of less than a second at a fuse current of about 60 mA.

In another embodiment, the indicator circuit 130 may allow for multiple activations of the indicator 125. In other words, the driver voltage is applied to the indicator 125 based on whether the energy storage device voltage is below the display threshold or not. If it is, the driver voltage is applied. If not, the driver voltage is not applied.

In all embodiments, the electrically coupling of the components of the state of charge indicator 100 may be done by conductive glue, soldering, welding, mechanical fastener such as a compression clamp or rivet, or through overlapping printing of the components to form electrically conductive bridges between printings. Conductive glue may be used to minimize resistance between connection points within the state of charge indicator 100. Furthermore, the first lead 115 and the second lead 120 and any other circuit traces shown in the figures are generally shown and are not representative of all the circuit traces required.

The steps of indicating when a main cell may need replacing may include detecting a main cell voltage of a main cell with at least one step indicator, applying a driver voltage with the indicator circuit to the indicator such that the indicator is inactive when the main cell voltage is greater than a display threshold, and applying the driver voltage with the indicator circuit to the indicator such that the indicator is active when the main cell voltage is less than the display threshold. The method of indicating may further include coloring a colored background that is at least partially covered by the indicator. The step of applying the driver voltage to the indicator may include shunting the indicator when the main cell voltage is greater than the display threshold such that the indicator is inactive and deactivating the shunt transistor across the indicator when the main cell voltage is less than the display threshold such that the indicator is active. The method of indicating may further include biasing the indicator with the auxiliary cell voltage when the main cell voltage is greater than the display threshold such that the indicator is inactive. The step indicator may be formed on the label, coupled to the label, or both and the last step may be applying the label formed around the main cell.

The state of charge indicator may be used to provide a visual indication of the amount of energy or charge remaining in a battery. The state of charge indicator is configured to endure long period of non-use or storage and to use an electro-chromic display only when it is needed. This ensures that the state of charge indicator is available for use despite the short service life of the electro-chromic display. The user will not need to actuate any contacts to energize the state of charge indicator, take any steps to activate the state of charge indicator, or intervene with state of charge indicator for the display of the state of the charge of the battery. Standby periods can extend for multiple years. For example, the indicator may remain in an inactive state for up to about 5 years and even up to about 10 years and still function appropriately when the display threshold is crossed. Once activated, the indicator will ideally "freeze" in about 3 hours to about 4 hours and remain colored regardless of further battery voltage changes or lack of voltage to power the indicator. The about 3 hour to about 4 hour delay is desired to avoid premature warning when the battery voltage drops under heavy pulse load for a short time but the battery is still not discharged, such as period of heavy energy consumption by the load.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any embodiment disclosed or claimed herein or that it alone, or in any combination with any other reference or references, teaches, suggests or discloses any such embodiment. Further, to the extent that any meaning or definition of a term in this document conflicts with any meaning or definition of the same term in a document incorporated by reference, the meaning or definition assigned to that term in this document shall govern.

While particular embodiments of the present disclosure have been illustrated and described, it would be obvious to those skilled in the art that various other changes and modifications can be made without departing from the spirit and scope of the disclosure. It is therefore intended to cover in the appended claims all such changes and modifications that are within the scope of this disclosure.

What is claimed is:

1. A state of charge indicator, comprising:
    an indicator with a display threshold; and
    an indicator circuit electrically coupled to the indicator such that when a main cell voltage of a main cell is greater than the display threshold, the indicator circuit applies a driver voltage to the indicator such that the indicator is inactive and when the main cell voltage is less than the display threshold, the indicator circuit applies the driver voltage to the indicator such that the indicator is active.

2. The state of charge indicator of claim 1, wherein the indicator is transmissive to light when inactive, and the indicator is colored when active.

3. The state of charge indicator of claim 2, further comprising a colored background that is at least partially covered by the indicator.

4. The state of charge indicator of claim 2, wherein, when the indicator fails, the indicator is substantially opaque.

5. The state of charge indicator of claim 1, wherein the indicator circuit further comprises:
a transistor driver circuit comprising:
a voltage divider circuit comprising a first resistor electrically coupled in series with a transition element and the transition element is electrically coupled in series with a second resistor,
a shunt transistor electrically coupled across the indicator and electrically coupled to the transition element and the second resistor, and
a pull-up resistor electrically coupled to the indicator.

6. The state of charge indicator of claim 1, wherein the state of charge indicator is a step indicator further comprising:
a second step indicator comprising:
a second indicator with a second display threshold,
a second indicator circuit electrically coupled to the main cell and the second indicator such that when the main cell voltage is greater than the second display threshold, the second indicator circuit applies a second driver voltage to the second indicator such that the second indicator is inactive and when the main cell voltage is less than the second display threshold, the second indicator circuit applies the second driver voltage to the indicator such that the second indicator is active, and
wherein the display threshold is greater than the second display threshold.

7. The state of charge indicator of claim 6, wherein the indicator, the second indicator, or both is indicative of a fraction of a fully charged main cell voltage value.

8. The state of charge indicator of claim 1, further comprising a label formed around the main cell, wherein a step indicator is printed on the label, coupled to the label, or both.

9. The state of charge indicator of claim 1, wherein the indicator is a fuse coupled to thermo-chromatic paper such that when the indicator is active, the fuse discolors the thermo-chromatic paper to transition the letter "F" to the letter "E".

10. The state of charge indicator of claim 1, wherein the indicator is a one-shot type indicator with a limited quantity of active material and the indicator is configured to indicate a state of charge when the indicator circuit applies the driver voltage to the indicator within a predetermined activated time corresponding to the limited quantity of active material.

11. The state of charge indicator of claim 1, wherein:
the indicator circuit is a CMOS output type voltage detector integrated circuit; and
the indicator is electrically coupled between a voltage output of the CMOS output type voltage detector integrated circuit and a ground connection.

12. The state of charge indicator of claim 11, wherein the CMOS output type voltage detector integrated circuit is a ROHM low voltage standard CMOS voltage detector integrated circuit.

13. The state of charge indicator of claim 1, wherein the indicator is configured to indicate a discharged main cell when the main cell is at about zero volts.

14. An energy storage replacement indicator system, comprising:
a display electrically coupled to an energy storage device with an energy storage voltage; and
an indicator circuit electrically coupled to the display, the indicator circuit establishes a display threshold such that when the energy storage voltage is greater than the display threshold, the indicator circuit applies a driver voltage to the display such that the display is inactive, and when the energy storage voltage is less than the display threshold, the indicator circuit applies the driver voltage to the display such that the display is active.

15. The energy storage replacement indicator system of claim 14, wherein the indicator circuit further comprises:
a transistor driver circuit comprising:
a voltage divider circuit comprising first resistor electrically coupled in series with a diode and the diode is electrically coupled in series with a second resistor,
a shunt transistor electrically coupled across the display and electrically coupled to the diode and the second resistor, and
a pull-up resistor electrically coupled to the display.

16. The energy storage replacement indicator system of claim 14, wherein the energy storage device is at least one battery or at least one capacitor.

17. The energy storage replacement indicator system of claim 14, wherein:
the indicator circuit is a CMOS output type voltage detector integrated circuit; and
the display is electrically coupled between a voltage output of the CMOS output type voltage detector integrated circuit and a ground connection.

18. The energy storage replacement indicator system of claim 17, wherein the CMOS output type voltage detector integrated circuit is a ROHM low voltage standard CMOS voltage detector integrated circuit.

19. A battery state of charge indicator, comprising:
a CMOS output type voltage detector integrated circuit; and
an indicator electrically coupled between a voltage output of the CMOS output type voltage detector integrated circuit and a battery having a battery voltage such that when the battery voltage is greater than a display threshold, the CMOS output type voltage detector integrated circuit applies a driver voltage to the indicator such that the indicator is inactive and when the battery voltage is less than the display threshold, the CMOS output type voltage detector integrated circuit applies the driver voltage to the indicator such that the indicator is active.

20. The battery state of charge indicator of claim 19, wherein the indicator is a ring indicator.

* * * * *